(12) United States Patent
Hsu

(10) Patent No.: US 8,971,095 B2
(45) Date of Patent: Mar. 3, 2015

(54) MEMORY ARCHITECTURE

(75) Inventor: Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 189 days.

(21) Appl. No.: 13/560,305

(22) Filed: Jul. 27, 2012

(65) Prior Publication Data
US 2014/0032835 A1   Jan. 30, 2014

(51) Int. Cl.
*G11C 11/00*   (2006.01)

(52) U.S. Cl.
USPC .................. 365/154; 365/189.09; 365/189.19; 365/230.05

(58) Field of Classification Search
USPC ................... 365/154, 189.09, 189.19, 230.05
See application file for complete search history.

(56) References Cited

U.S. PATENT DOCUMENTS

| | | | | |
|---|---|---|---|---|
| 7,684,264 B2 * | 3/2010 | Hunter et al. | ............... | 365/189.2 |
| 8,018,756 B2 * | 9/2011 | Hirabayashi | .................. | 365/154 |
| 8,619,477 B2 * | 12/2013 | Wang et al. | .............. | 365/189.04 |
| 8,625,333 B2 * | 1/2014 | Rao et al. | ....................... | 365/154 |
| 8,625,334 B2 * | 1/2014 | Liaw | ............................. | 365/154 |

* cited by examiner

*Primary Examiner* — Pho M Luu
(74) *Attorney, Agent, or Firm* — Lowe Hauptman & Ham, LLP

(57) ABSTRACT

A write circuit in a memory array includes a global data line, a switching circuit, and a first local data line coupled with the switching circuit and with a first plurality of memory cells. The global data line is configured to receive data to be written to the memory cell from outside of the memory array. The switching circuit is configured to electrically couple the global data line with the first local data line to transfer the data to be written to a memory cell of the first plurality of memory cells to the first local data line. The memory cell of the first plurality of memory cells is configured to receive data on the first local data line.

20 Claims, 6 Drawing Sheets

MEMORY ARCHITECTURE

FIELD

The present disclosure is related to a memory architecture.

BACKGROUND

In a memory array of a memory macro, a global bit line is coupled with a plurality of local input-output circuits (LIOs). Each LIO is shared by a pair of an upper memory bank and a lower memory bank of a memory segment. Each LIO is also coupled with a pair of local bit lines, one upper local bit line from the upper memory bank and one lower local bit line from the lower memory bank. Each upper and lower local bit line of a memory segment is coupled with a plurality of memory cells. In some approaches, the upper local bit line and the lower local bit line are coupled together.

In some approaches, the global bit line is electrically shorted with a plurality of pairs of upper and lower local bit lines from corresponding memory banks and memory segments. To write data to a memory cell, the data travels through the global bit line, a corresponding LIO, and a corresponding pair of upper and lower local bit lines. Because the global bit line is shorted with the plurality of pairs of upper and lower local bit lines, however, the memory cell to be written is affected by an effective capacitance of the global bit line and of the plurality of pairs of upper and lower local bit lines. A large effective capacitance of the global bit line and/or of each upper and lower local bit line degrades writing speed of the memory cells.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
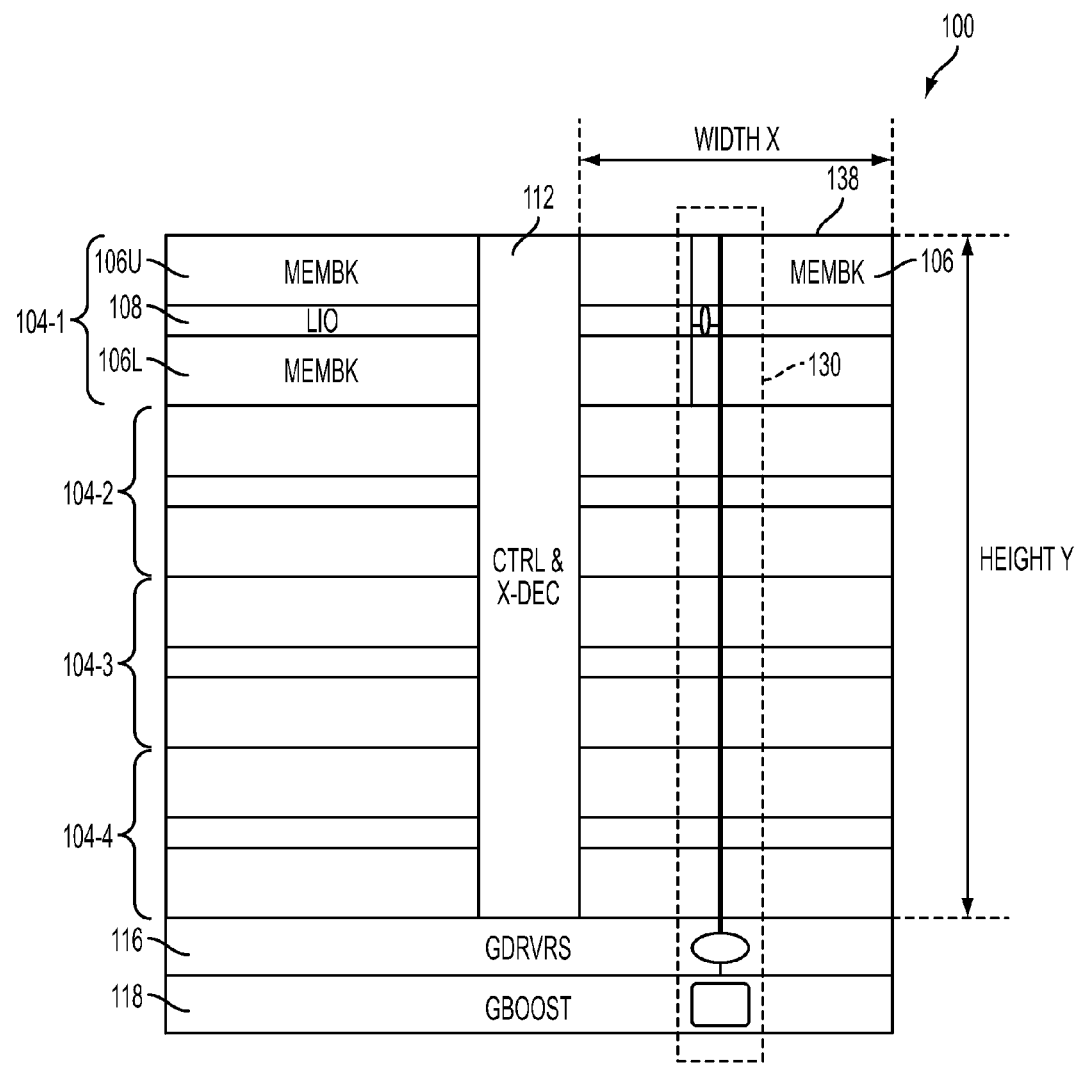
FIG. 1 is a block diagram of a memory macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A local bit line associated with a memory cell written is isolated from local bit lines associated with memory cells that are not to be written. An effective capacitance seen by the memory cell to be written is reduced compared with a corresponding capacitance in another approach. As capacitance is reduced, sizes of related circuits and dies are reduced. A write speed of the memory cell is improved because the time to pull the write bit line to a low logical value is reduced. Power consumed during the write operation of the memory cell is also reduced compared with the power consumed by the memory macro in another approach.

In this document, "rise" refers to transitioning from a low logical value to a high logical value, and "fall" refers to transitioning from a high logical value to a low logical value.

Memory Macro

FIG. 1 is a block diagram of a memory macro 100, in accordance with some embodiments. In the embodiment of FIG. 1, memory macro 100 is a static random access memory (SRAM) macro. SRAM is used for illustration. Other types of memories are within the scope of various embodiments.

Memory macro 100 is symmetrical. For example, with reference to a control and X-decode 112 labeled as CTRL & DEC 112, circuit elements on the left side are similar to circuit elements on the right side of memory macro 100. For another example, memory macro 100 includes two memory arrays, one on the left side and one on the right side. For illustration, one memory array on the right side is labeled as memory array 138, and has a width X and a height Y.

Memory macro 100 includes a plurality of memory segments 104. Four memory segments 104, labeled as 104-1, 104-2, 104-3, and 104-4, are shown for illustration. A different number of memory segments 104 is within the scope of various embodiments. Each memory segment 104 includes four memory banks labeled as MEMBK 106, two memory banks on the left and two memory banks on the right. For simplicity, only one memory bank MEMBK 106 is labeled.

On each left and right side of memory macro 100, two memory banks 106U and 106L share a row of a plurality of local input-output circuits LIOs 108. To avoid obscuring the drawing, two memory banks 106-U and 106-L on the left of memory segment 104-1 are labeled. For illustration, one LIO 108 on the left side of memory segment 104-1 is labeled.

Memory cells in a memory bank are arranged in rows and columns. As a result, memory cells in a memory segment 104 and in a memory array 138 are also arranged in rows and columns. A memory cell is described in detail with reference to FIG. 3 below, and is labeled 122. Different configurations of a memory segment 104 are within the scope of various embodiments.

Control and X-decode 112 provides the X- or row-address of memory cells to be accessed for a read or a write operation.

A plurality of write drivers 116, collectively labeled as GWDRVRS 116, serve to transfer data between the memory cells and other circuits outside of memory macro 100.

A plurality of negative boost circuits 118, collectively labeled as GBOOST 118, serve to pull a voltage value of global bit lines of memory macro 100 to a negative voltage value.

Write Circuit

Figure 2:
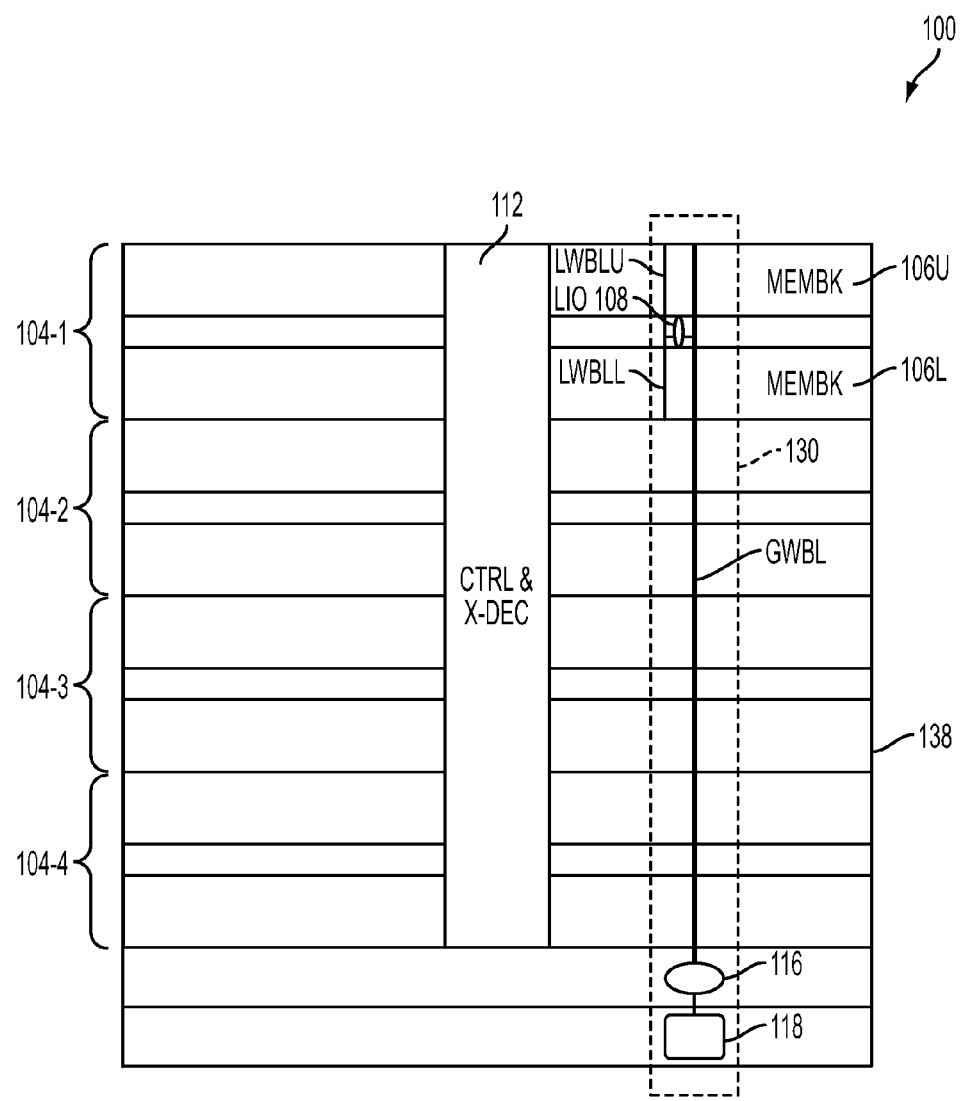
FIG. 2 is a block diagram of the memory macro in FIG. 1 having details of a write circuit, in accordance with some embodiments.

A write circuit 130 is shown to illustrate a write operation of memory macro 100 in accordance with various embodiments of the present disclosure. FIG. 2 is a diagram of memory macro 100 in which details of write circuit 130 are labeled, in accordance with some embodiments. For simplicity, various details of memory macro 100 in FIG. 1 are not labeled.

Write circuit 130 includes a negative boost circuit 118, a write driver 116, a global write bit line GWBL, an LIO 108, an upper local write bit line LWBLU, and a lower local write bit line LWBLL.

Each of local write bit lines LWBLU and LWBLL are coupled with a plurality of memory cells. To avoid obscuring the drawing, the memory cells are not labeled, however. In some embodiments, upper local write bit line LWBLU and lower local write bit line LWBLL are coupled together and are thus electrically shorted. Effectively, upper local write bit line LWBLU and lower local write bit line LWBLL constitute one single local write bit line. In the below illustration, a reference to a local write bit line refers collectively to both upper local write bit line LWBLU and lower local write bit line LWBLL. The plurality of memory cells coupled with upper local write bit line LWBLU are from a corresponding upper memory bank 106U while the plurality of memory cells coupled with lower local write bit line LWBLL are from a corresponding lower memory bank 106L.

In each memory segment 104-1, 104-2, 104-3, and 104-4, LIO 108 is coupled with the pair of upper local write bit line LWBLU and lower local write bit line LWBLL on one side, and, on the other side, is coupled with global write bit line GWBL. For simplicity, only LIO 108 of segment 104-1 is shown. Connections and operations of LIOs 108 of segments 104-2, 104-3, and 104-4 are similar.

Global write bit line GWBL extends the height Y of memory array 138, and is coupled with a plurality of LIOs 108 of the plurality of segments 104-1, 104-2, 104-3, and 104-4. For simplicity, however, global write bit line GWBL is shown coupled with one LIO 108 of memory segment 104-1.

One circuit 130 is shown for illustration. Each memory array 138 of memory macro 100 includes a plurality of circuits 130. The memory cells in circuit 130 constitute a column of memory array 138.

In some embodiments, in a write operation to a memory cell in a memory segment 104, the data to be written is received from outside of memory macro 100. Write driver 116 then provides the data corresponding to the data to be written to global write bit line GWBL. For example, when the data to be written is a logical low value, write driver 116 provides a signal to pull global write bit line GWBL to a low logical value. The logical low value to be written thus travels through global bit line GWBL, and the pair of upper local write bit line LWBLU and lower local write bit line LWBLL that are coupled with the memory cell to be written.

Negative boost circuit 118 boosts a voltage level of global write bit line GWBL. In some embodiments, boost circuit 118 pulls global write bit line GWBL from 0 V or ground to a negative voltage value, such as −150 mV. Different negative voltage values are within the scope of various embodiments.

In some embodiments, in a write operation of a memory cell in a memory segment 104, the memory cell to be written is affected by an effective capacitance contributed by a capacitance of global write bit line GWBL and an effective capacitance of a pair of upper local write bit line LWBLU and lower local write bit line LWBLL.

Memory Cell

Figure 3:
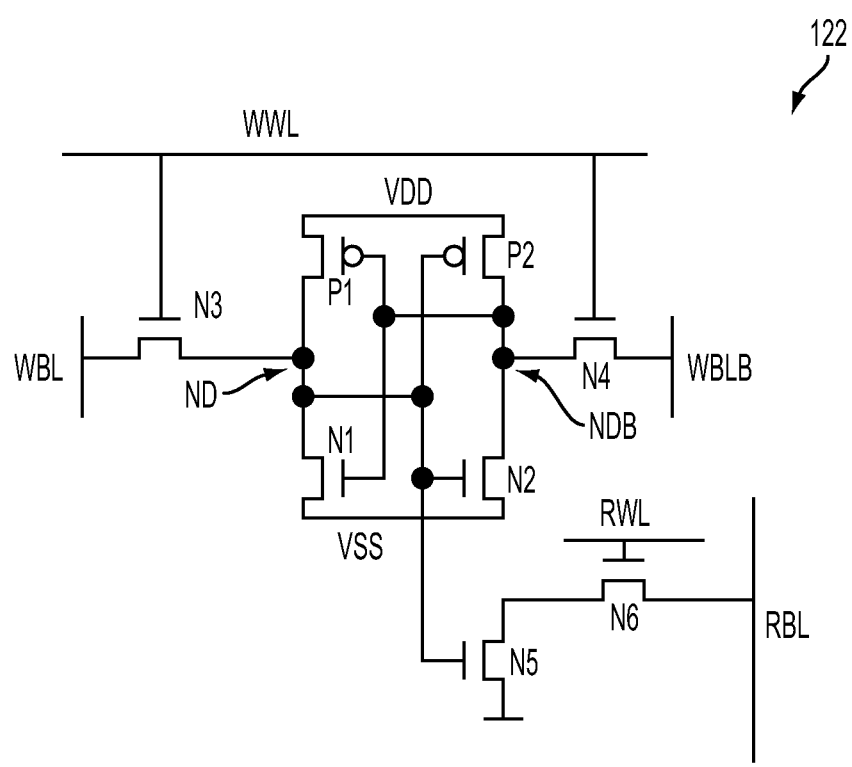
FIG. 3 is a diagram of a memory cell, in accordance with some embodiments.

FIG. 3 is a circuit diagram of a memory cell 122, in accordance with some embodiments. In some embodiments, a plurality of memory cells 122 is arranged in rows and columns of memory array 138 in FIG. 1.

Memory cell 122 includes two P-type metal oxide semiconductor (PMOS) transistors P1 and P2, and six N-type metal oxide semiconductor (NMOS) transistors N1, N2, N3, N4, N5, and N6. Transistors P1, P2, N1, and N2 form a cross latch. Drains of transistors P1 and N1 are coupled together and form a node ND. Drains of transistors P2 and N2 are coupled together and form a node NDB. Gates of transistors P1 and N1 are coupled together and to drains of transistors P2 and N2. Gates of transistors P2 and N2 are coupled together and to drains of transistors P1 and N1.

A write word line WWL is coupled with the gate of each of transistors N3 and N4 of a plurality of memory cells 122 in a row of memory array 138 in FIG. 1. Write word line WWL is also called a write control line because the signal on write word line WWL controls transistors N3 and N4 for data on write bit lines WBL and WBLB to be written to corresponding nodes ND and NDB.

Drains of each of transistors N3 and N4 are coupled to a pair of local write bit lines WBL and WBLB, respectively. Local write bit lines WBL and WBLB are coupled to each drain of transistors N3 and N4 of a plurality of memory cells 122 in a column of memory array 138.

Local write bit line WBL corresponds to upper local write bit line LWBLU if memory cell 122 is in memory bank MEMBK 106U of a segment 104 in FIG. 1, and corresponds to lower local write bit line LWBLL if memory cell 122 is in memory bank MEMBK 106L. Connections and operations of local write bit line WBLB are similar to those of local write bit line WBL. Each of local write bit lines WBL and WBLB is also called a write data line because data carried on local write bit lines WBL and WBLB are written to corresponding nodes ND and NDB.

In a write operation of memory cell 122, write word line WWL is activated to turn on transistors N3 and N4. Data to be written to memory cell 122 is represented by signals on local write bit lines WBL and WBLB, which is then transferred to and stored in nodes ND and NDB. In the example of circuit 130 in FIG. 2, the data from outside of memory macro 100 is received based on write driver 116, passes through global write bit line GWBL, LIO 108, local write bit lines LWBLU and LWBLL, and is written to node ND.

Transistors N5 and N6, and read word line RWL and read bit line RBL form a read port to process data read from nodes ND and NBD. Read bit line RBL is coupled with memory cells 122 in a column.

Local Input-Output Circuit

Figure 4:
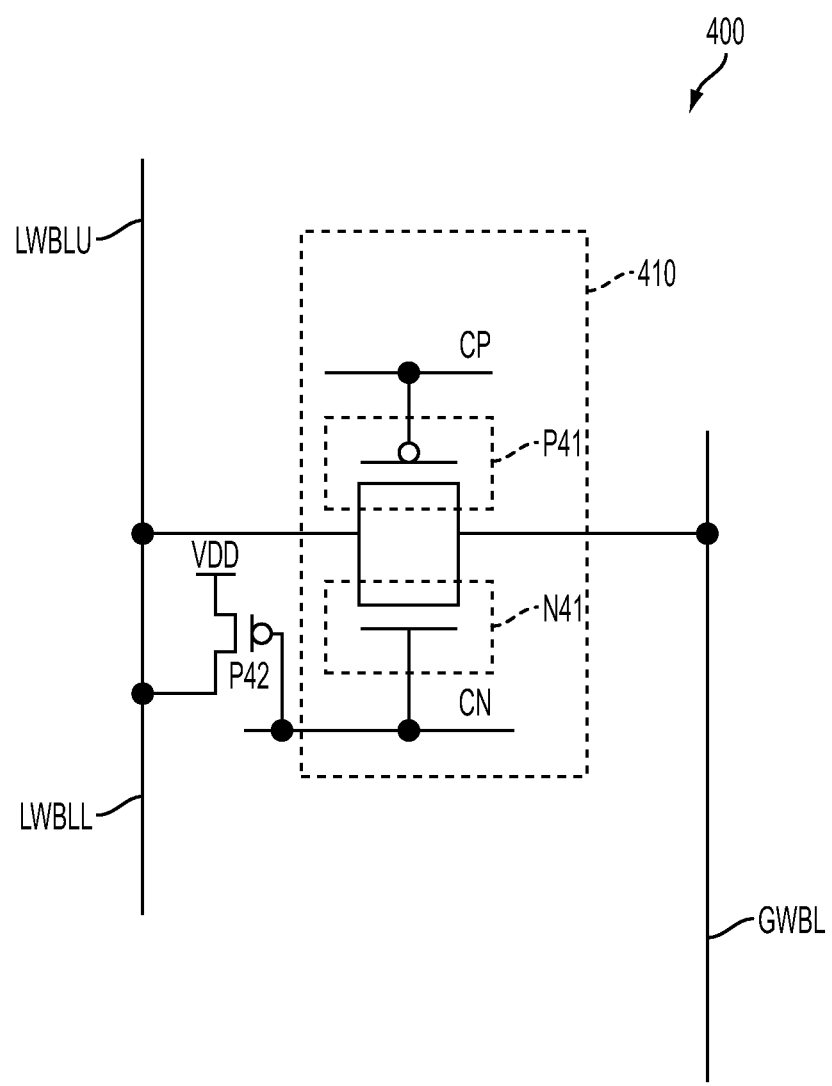
FIG. 4 is a circuit diagram of a local input-output and corresponding circuit elements of the memory macro in FIG. 1, in accordance with some embodiments.

FIG. 4 is a diagram of a circuit 400, in accordance with some embodiments. Circuit 400 includes LIO 108 and corresponding circuit elements of memory macro 100 in FIG. 1.

LIO 108 is implemented as a pass gate 410 formed by a PMOS transistor P41 and an NMOS transistor N41. One end of pass gate 410 is coupled with global write bit line GWBL, and the other end of pass gate 410 is coupled with upper local write bit line LWBLU and lower local write bit line LWBLL. Upper local write bit line and LWBLU and lower local write bit line LWBLL are coupled together.

Pass gate 410 functions as a switch, and is controlled by a signal CP at a gate of a PMOS transistor P41 and a signal CN at a gate of an NMOS transistor N41. Signals CP and CN are an inverse of one another. For example, when signal CP is logically high, signal CN is logically low, and vice versa. When signal CP is logically low and signal CN is logical high, pass gate 410 is activated to transfer a signal on global write bit line GWBL to local write bit lines LWBLU and LWBLL. But when signal CP is logically high and signal CN is logically low, pass gate 410 is deactivated, and functions as an open circuit. As a result, local write bit lines LWBLU and LWBLL are electrically disconnected from global write bit line GWBL. Pass gate 410 is used for illustration. Other circuitry functioning as a switch in place of pass gate 410 is within the scope of various embodiments.

A PMOS transistor P42 is used to pre-charge local write bit lines LWBLU and LWBLL. For example, when signal CN at a gate of PMOS transistor P42 is logically low, PMOS transistor P42 is turned on. As a result, local write bit lines LWBLU and LWBLL are pulled to operational voltage VDD at a source of PMOS transistor P42. When signal CN is logically low, signal CP is logically high. As a result, transistor P41 is deactivated, and global write bit line GWBL is electrically disconnected from local write bit lines LWBLU and LWBLL. Effectively, local write bit lines LWBLU and LWBLL are pre-charged when local write bit lines LWBLU and LWBLL are electrically disconnected from global bit line GWBL. In some embodiments, before writing data to a memory cell 122, local write bit lines LWBLU and LWBLL coupled to the memory cell 122 to be written are pre-charged to a high logical value. Write word line WWL of memory cell 122 in FIG. 3 is activated to turn on transistor N3. The data to be written to memory cell 122 is placed at global write bit line GWBL, and is transferred to local write bit lines LWBLU and WWBLL, then node ND.

In some embodiments, in a write operation, pass gate 410 corresponding to local write bit lines LWBLU and LWBLL coupled with the memory cell 122 to be written is activated, but pass gates 410 corresponding to local write bit lines LWBLU and LWBLL in memory segments 104 that do not include the memory cell 122 to be written is deactivated. Effectively, global write bit line GWBL is electrically coupled with local write bit lines LWBLU and LWBLL corresponding to the memory cell 122 to be written, but is not coupled with local write bit lines LWBLU and LWBLL of memory segments 104 that do not include the memory cell 122 to be written. For example, with reference to circuit 130 in FIG. 2, pass gate 410 in memory segment 104-1 is activated. As a result, global write bit line GWBL is coupled with local write bit lines LWBLU and LWBLL of memory segment 104-1, but is not coupled with local write bit lines LWBLU and LWBLL of memory segments 104-2, 104-3, and 104-4.

In some embodiments, in a standby mode, a leakage current in memory macro 100 is minimized. Pass gates 410 in macro 100 are deactivated and PMOS transistors P42 in macro 100 are activated. As a result, local write bit lines LWBLU and LWBLL in memory macro 100 are at a high logical value.

Pull Down and Boost Circuits

In some embodiments, when global write bit line GWBL and corresponding local write bit lines LWBLU and LWBLL are pulled to a low logical value, global write bit line GWBL and corresponding local write bit lines LWBLU and LWBLL are pulled to ground or zero volts, and are then pulled to a predetermined negative voltage value, such as −150 mV. Different voltage values are within the scope of various embodiments.

Figure 5:
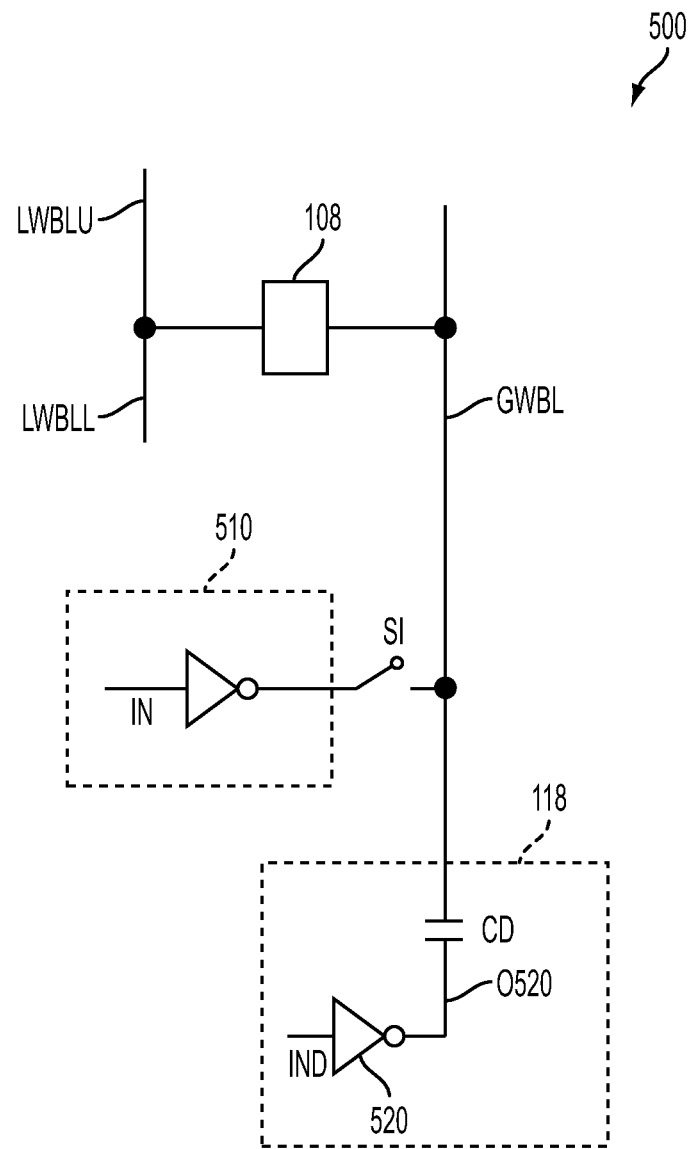
FIG. 5 is a diagram of a global booster circuit and related circuit elements, in accordance with some embodiments.

FIG. 5 is a diagram of a global booster circuit 500, in accordance with some embodiments. A write bit line driver 510 generates a logical value for global write bit line GWBL. For example, before writing, global write bit line GWBL and corresponding local write bit lines LWBLU and LWBLL are pre-charged to a high logical value. Write bit line driver 510 inverts signal IN having a high logical value to generate a low logical signal on global write bit line GWBL and corresponding local write bit lines LWBLU and LWBLL. In some embodiments, the low logical value at the output of write bit line driver 510 is ground or 0 V. For illustration, a voltage at global write bit line GWBL is called voltage VWBL. Negative boost circuit 118 causes voltage VWBL to have a predetermined negative voltage value. Explained in another way, negative boost circuit 118 boosts voltage VWBL from 0 V to the predetermined negative voltage value.

In some embodiments, after global write bit line GWBL transitions from a high to a low logical value, a switch Si is opened to electrically disconnect global write bit line GWBL from the output of write bit line driver 510. A boost driver 520 then causes a high to a low logical value at an output O520 of boost driver 520, which, together with capacitor CD, causes a negative voltage for voltage VWBL. Effectively, negative boost circuit 118 boosts voltage VWBL.

For illustration, a reference ΔWBL represents the boosted voltage of voltage VWBL, which is a change of voltage VWBL from 0 V to a predetermined negative voltage value, such as −150 mV. A voltage VO520 is a voltage at output O520. A reference ΔVO520 is a change of voltage VO520, which is a difference between a high and a low logical value of voltage VO520. For further illustration, an effective capacitance of global write bit line GWBL is called CWBL. An effective capacitance of negative boost circuit 118 is called CBST and includes capacitance of capacitor CD and of boost driver 520. In some embodiments, voltage ΔWBL, voltage ΔVO520, capacitance CWBL, and capacitance CBST are related based on the following equation:

ΔWBL=(CBST/(CBST+CWBL))*ΔVO520

In some embodiments, capacitance CWBL is reduced by about 50% compared with an existing approach. As a result, bit line driver 510, capacitor CD, and boost driver 520 are made to be smaller but result in the same voltage ΔWBL. As a result, die sizes of circuit 130 and thus of macro 100 are smaller compared with those of the existing approach.

Exemplary Method

Figure 6:
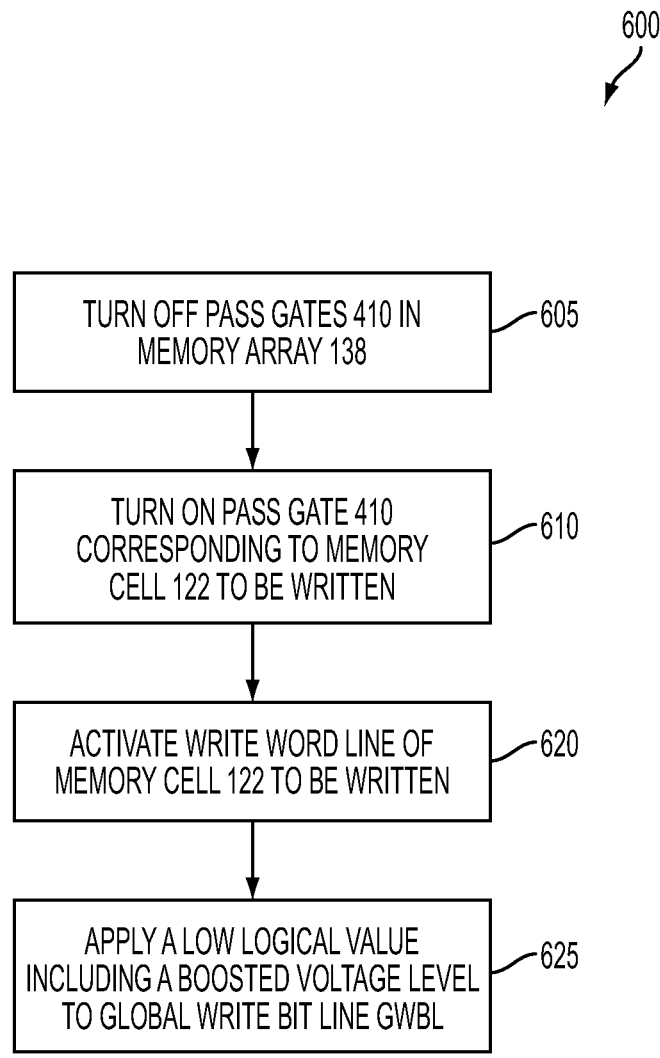
FIG. 6 is a flowchart of a method of writing data to a memory cell, in accordance with some embodiments.

FIG. 6 is a flowchart of a method 600 of writing to a memory cell 122, in accordance with some embodiments. For illustration, memory cell 122 to be written is one of memory cells coupled with local write bit lines LWBLU and LWBLL of memory segment 104-1, and writing is by write circuit 130 in FIG. 2. Further, node ND of memory cell 122 to be written initially stores a high logical value, and is to be written with a low logical value. Writing to a memory cell 122 in other memory segments is similar.

In step 605, all pass gates 410 in memory array 138 are tuned off to electrically disconnect global write bit line GWBL from all local write bit lines LWBLU and LWBLL. As a result, global write bit line GWBL is electrically disconnected from local write bit lines LWBLU and LWBLL of memory segments 104-1, 104-2, 104-3, and 104-4. At the same time, by operation of PMOS transistors P42 in corresponding circuits 400, local bit lines LWBLU and LWBLL of memory segments 104-1, 104-2, 104-3, and 104-4 are pre-charged to a high logical value.

In step 610, pass gate 410 corresponding to memory cell 122 to be written is activated to electrically couple global write bit line GWBL to corresponding local write bit lines LWBLU and LWBLL. In the example of circuit 130, global bit line GWBL is coupled with local write bit lines LWBLU and LWBLL of memory segment 104-1. Effectively, global write bit line GWBL and local write bit lines LWBLU and LWBLL of memory segment 104-1 are pre-charged to a high logical value.

In step 620, write word line WWL of memory cell 122 to be written is activated to turn on corresponding transistor N3 of memory cell 122 to be written.

In step 625, a low logical value including a boosted voltage level is applied to global write bit line GWBL and thus to local write bit lines LWBLU and LWBLL of memory segment 104-1. As a result, node ND of the memory cell 122 to be written is pulled to the low logical value at local write bit lines LWBLU and LWBLL of memory segment 104-1. In other words, node ND of memory cell 122 is written with a low logical value.

Various embodiments of the disclosure are advantageous over some existing approaches. For illustration, capacitance of a portion of global write bit line GWBL in each upper memory bank and lower memory bank of a memory segment 104 is 1 C. As a result, total capacitance of global write bit line GWBL in circuit 130 in FIG. 2 is 8 C. In some embodiments, capacitance of each of upper local write bit line LWBLU and lower local write bit line LWBLL is 2 C. Capacitance of local write bit lines LWBLU and LWBLL in a memory segment 104 is therefore 4 C. Total capacitance of global write bit line GWBL and local write bit lines LWBLU and LWBLL of write circuit 130 is 12 C. In some existing approaches, in a write operation, global write bit line GWBL is also coupled with local write bit lines LWBLU and LWBLL in non-accessed memory segments. For example, in FIG. 2, global write bit line GWBL of the existing approaches not only couples with local write bit lines LWBLU and LWBLL of memory segment 104-1, but also couples with local write bit lines LWBLU and WLBLL of non-accessed memory-segments 104-2, 104-3, and 104-4. As a result, capacitance seen by the memory cell 122 to be written is that of capacitance of global write bit line GWBL and of local write bit lines LWBLU and LWBLL of four segments 104-1, 104-2, 104-3, and 104-4, for a total capacitance of 24 C. Compared with the existing approaches, capacitance seen by a memory cell 122 in a write operation of various embodiments of the present disclosure is reduced from 24 C to 12 C, or is reduced by 50%. As capacitance is reduced, sizes of related circuits and corresponding dies are reduced. For example, in some embodiments, the die area for negative boost circuits 118 is reduced to about 66% of the die area of corresponding boost circuits of an existing approach.

A write speed of a memory cell is also improved because the time to pull the write bit line to a low logical value is reduced. For example, local write bit lines LWBLU and LWBLL in the accessed memory segment 104-1 are pulled and boosted down, compared with local write bit lines LWBLU and LWBLL in all memory segments 104-1, 104-2, 104-3, and 104-4 in memory array 138 are pulled and boosted down in some existing approaches. As a result, a negative boost voltage level is less, and the time to pull down local write bit lines LWBLU and LWBLL is shorter, and writing speed is therefore improved. In addition, dynamic power is reduced compared with that of in the existing approach.

The above illustrations are in the context of writing a low logical value to node ND using two local write bit lines WBL in FIG. 3 as local write bit lines LWBLU and LWBLL in FIG. 2. Writing a low logical value to node NDB using two local write bit lines WBLB in FIG. 3 is similar. In some embodiments, by operations of memory cell 122, writing a low logical value to node ND also writes a high logical value to node NDB, and writing a low logical value to node NDB also writes a high logical value to node ND.

A number of embodiments have been described. It will nevertheless be understood that various modifications may be made without departing from the spirit and scope of the present disclosure. For example, various transistors being shown as a particular dopant type (e.g., N-type or P-type metal oxide semiconductor (NMOS or PMOS)) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. Various figures show discrete capacitors for illustration. Equivalent circuitry may be used. For example, a capacitive device, circuitry or network, such as a combination of capacitors, capacitive devices, circuitry, etc., can be used in place of the discrete capacitor. A drain of a transistor can be configured as a source of the same transistor, and vice versa.

In some embodiments, a write circuit in a memory array comprises a global data line, a switching circuit, a first local data line coupled with the switching circuit and with a first plurality of memory cells. The global data line is configured to receive data to be written to a memory cell of the first plurality of memory cells from outside of the memory array. The switching circuit is configured to electrically couple the global data line with the first local data line to transfer the data to be written to the memory cell of the first plurality of memory cells to the first local data line. The memory cell of the first plurality of memory cells is configured to receive data on the first local data line.

In some embodiments regarding a method of writing to a memory cell to be written, a first logical value is applied to a first local data line of a plurality of local data lines. The first local data line is selectively connected to a global data line, resulting in the first local data line being coupled with the global data line while other local data lines of the plurality of local data lines are disconnected from the global data line. The memory cell to be written is activated. A second logical value is applied to the global data line and the first local data line to transfer the second logical value on the first local data line to a node of the memory cell to be written. The first local data line is coupled with a plurality of first memory cells including the memory cell to be written.

In some embodiments, a memory array comprises a plurality of global data lines, a plurality of switching circuits, a plurality of pairs of local data lines, and a plurality of charging circuits. Each switching circuit of the plurality of switching circuits is coupled with a global data line of the plurality of global data lines and with a pair of local data lines of the plurality of pairs of local data lines. Each pair of local data lines of the plurality of pairs of local data lines includes a first local data line and a second local data line. Each first local data line of each pair of local data lines is coupled with each first plurality of memory cells. Each second local data line of each pair of local data lines is coupled with each second plurality of memory cells and with a corresponding first local data line of each pair of local data lines. Each charging circuit of the plurality of charging circuits is coupled with each pair of local data lines of the plurality of pairs of local data lines.

The above examples include exemplary steps, but the steps are not necessarily performed in the order shown. Steps may be added, replaced, changed order, and/or eliminated as appropriate, in accordance with the spirit and scope of disclosed embodiments.

What is claimed is:

1. A write circuit in a memory array, comprising:
a global data line;
a switching circuit;
a first local data line coupled with the switching circuit and with a first plurality of memory cells; and
a boost circuit configured to change a voltage level of the global data line to a first voltage value different from a second voltage value and a third voltage value,
wherein
the global data line is configured to receive data to be written to a memory cell of the first plurality of memory cells from outside of the memory array;
the switching circuit is configured to electrically couple the global data line with the first local data line to transfer the data to be written to the memory cell of the first plurality of memory cells to the first local data line;
the memory cell of the first plurality of memory cells is configured to receive transferred data to be written to the memory cell on the first local data line; and
the second voltage value represents a first logical value and the third voltage value represents a second logical value different from the first logical value.

2. The write circuit of claim 1, wherein
the write circuit further comprises a second local data line coupled with the switching circuit and with a second plurality of memory cells;
the first local data line and the first plurality of memory cells correspond to a first memory bank of the memory array; and
the second local data line and the second plurality of memory cells correspond to a second memory bank of the memory array.

3. The write circuit of claim 2, wherein
the first local data line is coupled with the second local data line.

4. The write circuit of claim 1, wherein the boost circuit comprises:
a boost driver configured to output two different voltage levels having a predetermined voltage difference $\Delta VO$; and
a capacitive device comprising a first end and a second end, the first end being coupled with the global data line, and the second end being coupled with the boost driver, the capacitive device being configured to cause the boost circuit to have an effective capacitance CBST, and the capacitance of the capacitive device being determinable based on the following equation:

$$\Delta WBL=(CBST/(CBST+CWBL))*\Delta VO,$$

CWBL referring to an effective capacitance of the global data line, and $\Delta WBL$ referring to a voltage difference between the third voltage value and the first voltage value.

5. The write circuit of claim 1, wherein
the switching circuit comprises a pass gate having a first end coupled with the global data line and a second end coupled with the first local data line.

6. The write circuit of claim 5, further comprising:
a transistor having a first terminal coupled with the first local data line and a second terminal coupled with a control terminal of the pass gate.

7. The write circuit of claim 1, further comprising a charging circuit configured to charge the first local data line when the first local data line is electrically disconnected from the global data line.

8. The write circuit of claim 1, further comprising:
a write driver configured to provide data to the global data line corresponding to the data to be written to the memory cell.

9. A method of writing to a memory cell to be written, comprising:
applying a first voltage value corresponding to a first logical value to a first local data line of a plurality of local data lines;
selectively connecting the first local data line to a global data line, resulting in the first local data line being coupled with the global data line while other local data lines of the plurality of local data lines are disconnected from the global data line;
activating the memory cell to be written;
applying a second voltage value corresponding to a second logical value to the global data line and the first local data line to transfer the second logical value on the first local data line to a node of the memory cell to be written; and
changing a voltage level of the global data line from the second voltage value to a third voltage value different from the first voltage value and the second voltage value,
wherein
the first local data line is coupled with a plurality of first memory cells including the memory cell to be written.

10. The method of claim 9, wherein
applying the first logical value to the first local data line comprises activating a transistor coupled with the first local data line.

11. The method of claim 10, wherein
applying the first logical value to the first local data line further comprises deactivating a pass gate coupled with the first local data line and the global data line to electrically disconnect the first local data line from the global data line.

12. The method of claim 9, wherein
selectively connecting a first local data line of a plurality of local data lines to a global data line comprises activating a pass gate corresponding to the first local data line.

13. The method of claim 9, wherein
applying the first logical value to the first local data line and selectively connecting the first local data line of the plurality of local data lines to the global data line are performed based on a control signal being applied to a first terminal of a transistor;
the transistor is coupled with the first local data line and with a first terminal of a pass gate; and
the pass gate is coupled with the first local data line and with the global data line.

14. The method of claim 9, wherein the changing the voltage level of the global data line from the second voltage value to the third voltage value is performed by a boost circuit, the boost circuit comprising:
a boost driver configured to output two different voltage levels having a predetermined voltage difference $\Delta VO$; and
a capacitive device comprising a first end and a second end, the first end being coupled with the global data line, and the second end being coupled with the boost driver, the capacitive device being configured to cause the boost circuit to have an effective capacitance CBST, and the capacitance of the capacitive device being determinable based on the following equation:

$$\Delta WBL=(CBST/(CBST+CWBL))*\Delta VO,$$

CWBL referring to an effective capacitance of the global data line, and $\Delta WBL$ referring to a voltage difference between the second voltage value and the third voltage value.

15. A memory array comprising:
a plurality of global data lines;
a plurality of switching circuits;
a plurality of pairs of local data lines; and
a plurality of charging circuits,
wherein
   each switching circuit of the plurality of switching circuits is coupled with a global data line of the plurality of global data lines and with a pair of local data lines of the plurality of pairs of local data lines;
   each pair of local data lines of the plurality of pairs of local data lines includes a first local data line and a second local data line;
   each first local data line of each pair of local data lines is coupled with a first plurality of memory cells;
   each second local data line of each pair of local data lines is coupled with a second plurality of memory cells and with a corresponding first local data line of each pair of local data lines; and
   each charging circuit of the plurality of charging circuits is coupled with a pair of local data lines of the plurality of pairs of local data lines.

16. The memory array of claim 15, wherein
each charging circuit of the plurality of charging circuits is further coupled with a switching circuit of the plurality of switching circuits at a control node; and
the control node is configured to receive a control signal to simultaneously control a charging circuit and a corresponding switching circuit.

17. The memory array of claim 15, wherein
each switching circuit includes a pass gate;
a first end of the pass gate is coupled with the global data line of the plurality of global data lines; and
a second end of the pass gate is coupled with the pair of local data lines of the plurality of pairs of local data lines.

18. The memory array of claim 17, wherein
each charging circuit includes a transistor;
a first terminal of the transistor is coupled with the pair of local data lines of the plurality of pairs of local data lines; and
a second terminal of the transistor is coupled with a control terminal of the pass gate and is configured to receive a control signal.

19. The memory array of claim 15, wherein
each charging circuit is configured to pull a corresponding pair of local data lines to a high logical value.

20. The memory array of claim 15, further comprising at least one of:
a plurality of driver circuits; or
a plurality of booster circuits,
wherein
   each driver circuit of the plurality of driver circuits is configured to pull a corresponding global data line from a high logical value to a low logical value; and
   each booster circuit of the plurality of booster circuit is configured to pull a corresponding global data line to a negative voltage value.

* * * * *